United States Patent [19]

Prud'Homme

[11] Patent Number: 4,820,446

[45] Date of Patent: Apr. 11, 1989

[54] ELECTRICALLY CONDUCTIVE, POTENTIALLY ADHESIVE COMPOSITION

[75] Inventor: Christian Prud'Homme, Lyon, France

[73] Assignee: Ciba-Geigy Corporation, Ardsley, N.Y.

[21] Appl. No.: 117,717

[22] Filed: Nov. 6, 1987

[30] Foreign Application Priority Data

Nov. 14, 1986 [FR] France ................................ 86 16045

[51] Int. Cl.$^4$ .............................................. H01B 1/06
[52] U.S. Cl. ................................... 252/511; 252/514; 252/516; 252/512; 524/439; 524/413; 524/496
[58] Field of Search ............... 252/514, 512, 511, 516; 524/439, 440, 495, 496, 413; 525/478; 528/15, 31, 10, 33, 37, 43

[56] References Cited

U.S. PATENT DOCUMENTS

| | | | |
|---|---|---|---|
| 3,522,142 | 7/1970 | Wismer et al. | 160/190 |
| 4,233,427 | 11/1980 | Bargain et al. | 525/478 |
| 4,431,982 | 2/1984 | Monroe et al. | 252/511 |
| 4,589,999 | 5/1986 | Vasta | 252/511 |

OTHER PUBLICATIONS

Chem. Abst. 101, 142357z (1984).
Chem. Abst. 85, 78842a (1976).

*Primary Examiner*—Josephine Barr
*Attorney, Agent, or Firm*—Luther A. R. Hall

[57] ABSTRACT

The present invention relates to electrically conductive, potentially adhesive compositions and to films formed from these compositions which are capable of being employed in particular for the adhesive bonding of the surfaces of electronic devices.

These compositions are characterized in that they comprise a thermoplastic block copolymer containing polysiloxane and urethane groups, with elastomeric properties and particles whose surface at least is electrically conductive and, if appropriate, a solvent or diluent.

16 Claims, No Drawings

ELECTRICALLY CONDUCTIVE, POTENTIALLY ADHESIVE COMPOSITION

The present invention relates to potentially adhesive electrically conductive compositions which are capable of being employed in particular for the adhesive bonding of the surfaces of electronic devices.

There are known adhesive, electrically conductive, compositions which consist of an epoxide resin in which there are dispersed flakelets of silver or particles of other electrically conductive metals such as gold, nickel and copper. A distinction is made between the "single-component" compositions, whose storage and transport require refrigeration and whose storage life at a normal ambient temperature (of the order of 25° C.) is limited, and two-component compositions, the major disadvantage of which is the need for mixing the resin with its hardener before use. Both types of composition are the result of a compromise between the contradictory requirements of a satisfactory lifetime and a rapid cross-linking rate. The application of compositions of this nature calls for the crosslinking of the epoxide resin at a relatively high temperature and for a sufficient time, with the compositions also containing a catalyst, a hardener and various ingredients in order to accelerate or retard the crosslinking.

The assembly of, for example, a chip onto a substrate such as a mounting frame ("lead frame" in U.S. terminology) is performed by application of a thin film of an adhesive of this type followed by the polymerization in the region of 100° to 180° C. for a period which is generally between 3 and 60 minutes. Notwithstanding the fact that the chip fastened in this manner is difficult to peel off, subsequent welding operations of, for example, the legs and the connecting wire between the chip and the substrate, by thermocompression, and the processes of encapsulating the device may modify the resin.

Furthermore, epoxide resins filled with silver particles form rigid films which have changed size during the crosslinking. These films are incapable of satisfactorily withstanding the stresses resulting, for example, from differential thermal expansions. While the ruptures, cracks and losses of adhesion are not very likely to appear on adherent or adhesive surfaces of small dimensions such as those of a square with a one-millimeter side, these defects become very pronounced when the surface coated with the conductive adhesive is larger in size, such as that of a square with a side of several centimeters. Furthermore, the adherent surfaces bonded by sandwiching a layer of conductive adhesive are liable to process very difficult thermal expansion coefficients and, by virtue of this fact alone, give rise to additional stresses which are all the more sensitive the larger the surfaces to be bonded. Insofar as the tendency of the present technologies is, on the one hand, towards maximum integration and, on the other hand, towards an increasing development of the hybrid technology and hence an appreciable increase in the surfaces to be bonded, which are frequently of different kind, the problems related to the rigidity of the adhesive layer cannot be overlooked.

It would also be possible to envisage adhesive, electrically conductive compositions consisting of a polyamide resin and a solvent like N-methylpyrrolidone or an acidic polyamide and a solvent of the same type, which are filled with silver particles. Compositions of the first type may be deposited onto a surface to be bonded and will then be heated from 140° to 200° C. to evaporate the solvent. Compositions of the second type may be subjected to the same kind of treatment, but the heating will cause cyclization with the generation of water, and this will be seen as the formation of bubbles in the film which is deposited. In addition, in the presence of silver, the $N-(CO_2)-C_6H_4-$ rings rupture more or less easily under the effect of the temperature, and this gives rise to a product degradation. In addition, these compositions, which do not permit the manufacture of self-supporting films and which are always in liquid form in a solvent medium, give rise to films with a thermal expansion coefficient which is low but which remains very high in relation to those of the components to be bonded.

There are also known compositions which are electrically conductive but which are lower in adhesive power, which withstand the differential expansions better and which consist of a silicon elastomer and of silver particles. However, these compositions, which are capable of being crosslinked under the effect of the temperature, encounter the same disadvantages as the epoxide adhesives in respect of the compromise to be found between acceptable crosslinking conditions and a suitable lifetime when stored under normal conditions.

Furthermore, these elements require the presence of reinforcing fillers (such as fumed silica) and a crosslinking operation in order to be capable of giving rise to films or circuit boards whose mechanical properties are appreciable although inadequate. These fillers are furthermore incompatible with the search for a satisfactory electrical conductivity.

Lastly, more recently (cf. Japanese Patent Application No. 59/107,528) there have been proposed electrically conductive compositions consisting of a para-phenylene polysulfide and silver particles, the application of the thermoplastic being carried out thermally, at an elevated temperature (220° C.). Films formed from such compositions are rigid and do not withstand differential expansions in a satisfactory manner. In addition, films formed from such compositions are not self-supporting.

In view of the present tendencies of the technology of manufacture of electronic devices, of their integration density and of the increasing essential requirements for automated production, it was necessary to provide potentially adhesive electrically conductive compositions whose application and storage are made easier by the absence of chemical reaction—in the sense that there is no condensation, crosslinking or addition—which, owing to their reversible adhesive or potentially adhesive nature, make it possible to envisage the replacement or the repair of defective components before refitting and which are capable of better withstanding the differential stresses while exhibiting high ionic purity. It was also necessary to provide such compositions capable of giving rise to films or circuit boards with improved mechanical properties and not requiring the presence of reinforcing fillers.

The subject of the present invention is therefore a potentially adhesive electrically conductive composition including a thermoplastic block copolymer containing polysiloxane and urethane groups, possessing elastomeric properties and particles whose surface at least is electrically conductive. The compositions according to the invention may also contain a solvent or diluent.

Another subject of the present invention is a flexible, if appropriate self-supporting, film formed from the compositions in question, a device comprising at least one face coated with a film formed from the compositions in question and a device comprising at least three superposed layers, the middle layer being a film formed from the compositions in question.

An additional subject of the present invention is the use of the compositions according to the invention in adhesive bonding by surface mounting of an encapsulated component having legs intended to be fastened onto electrically conductive tracks present on a base; a small fragment of composition such as a drop may be deposited under the component in order to position it and to hold it in place while the remelting of the beads of Au-Si eutectic situated at the ends to be joined, either of the tracks or of the legs, is carried out. A small fragment of composition may be deposited alternatively or conjointly at each end either of the tracks or of the legs of the component as a replacement for the beads of eutectic just mentioned.

A further subject of the invention is the use of the compositions according to the invention for adhesive bonding of an active component onto a substrate in the technology known as that of hybrid circuits; the side of the component facing the substrate will be coated with a film of composition or will be brought into contact with such a film deposited onto the substrate in order to be fastened thereon, it being possible for the connections between the electrically conductive tracks present on the same face of the substrate and the added component to be produced by means of a gold or aluminium wire.

Also envisaged is the adhesive bonding of a chip onto a mounting frame (a technique which is more widely known by the English name of "die-bonding").

Another object of the invention is the use of a film formed from a composition according to the invention arranged in a frame which is in most cases planar and circular and slightly larger in diameter than that of a silcon wafer, the reverse side of the wafer (the face which is generally unpolished and opposite that on which semiconductive components are or will be developed) coming into intimate contact with one of the faces of the said film, the film-wafer assembly being made integral before being cut up, in most cases by sawing, to form a plurality of chips comprising a thin layer of the film in question on their reverse side. Each of the said chips which are coated in this manner may, for example, be lifted up by an automatic device and then moved and positioned, if appropriate, with a view to being adhesively bonded onto a substrate or a mounting frame.

The film arranged in the frame (or drum) may be so arranged by means of a film or of a sheet of another material situated under the face of the potentially adhesive film which is opposite that onto which the silicon wafer would be positioned. The potentially adhesive film may be in the form of a continuous surface or in the form of a plurality of unitary surfaces of more or less complex outlines which can be produced, particularly by serigraphy.

The potentially adhesive electrically conductive compositions according to the present invention include at least one block copolymer containing polysiloxane and urethane groups possessing elastomeric properties.

These copolymers consist of a concatenation of recurring repeat units (I) and (II) corresponding respectively to the following formulae (I) and (II):

Repeat unit (I), Formula (I):

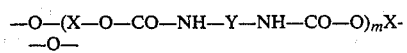
—O—

Repeat unit (II), Formula (II):
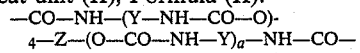

in which the various symbols have the following meanings:

Z denotes a divalent radical bearing a polysiloxane block and having the formula (III),

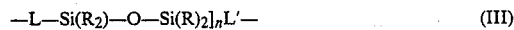 (III)

in which:

L and L', which are identical or different, denote divalent radicals of formula (IV):

 (IV)

in which:

T denotes a divalent radical forming part of the molecular structure of an unsaturated isocyanate or of an unsaturated alcohol of formulae:

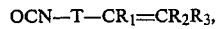

these radicals T being hydrocarbon in nature and containing from 1 to 20 carbon atoms, capable, where appropriate, of including one or more hetero atoms or groups chosen from oxygen, sulfur, silicon and nitrogen atoms and ester or amide groups, $R_1$, $R_2$ and $R_3$ independently denote a hydrogen atom or an alkyl or aryl group, it being possible for $R_1$ and $R_2$ to form an alkylene radical together, R, which are identical or different, denote: alkyl or haloalkyl radicals containing from 1 to 5 carbon atoms and containing, where appropriate, from 1 to 7 chlorine and/or fluorine atoms, cycloalkyl or haloalkyl radicals containing from 3 to 8 carbon atoms and, where appropriate, from 1 to 4 chloride and/or fluorine atoms, alkenyl radicals containing from 2 to 5 carbon atoms, aryl, alkylaryl and haloaryl radicals containing from 6 to 8 carbon atoms and containing, where appropriate, from 1 to 4 chlorine and/or fluorine atoms, and n is a number from 1 to 1000 inclusive, X and Y denote devalent radicals of hydrocarbon nature corresponding, respectively, to the diol X(OH)$_2$ and to the diisocyanate Y(NCO)$_2$, each containing from 2 to 20 carbon atoms, m denotes a number from 1 to 20 inclusive, and a is zero or one.

The block copolymer preferably consists of a concatenation of repeat units (I) and (II) corresponding respectively to the formulae (I) and (II) above, in which the various symbols have more particularly the following meanings:

T denotes:
- an alkylene, cycloalkylene, arylene, alkylarylene or arylakylene group,
- a concatenation of two groups chosen from alkylene, cycloalkylene and arylene groups and linked together by the valency bond, an oxygen atom, a sulfur atom, an ester or amide group, a nitrogen-containing group [—N(R$_4$)—] in which R$_4$ denotes a hydrogen atom or an alkyl group, or a diorganosilyl group [—Si(R')$_2$—] in which R' denotes a methyl, vinyl or phenyl radical, it being possible for these diverse radicals to be halogenated, where appropriate, R$_1$, R$_2$ and R$_3$ denote:
- a hydrogen atom,
- an alkyl radical containing from 1 to 4 carbon atoms,
- a phenyl or tolyl radical, and
- it being possible for R$_1$ and R$_2$ together to form a straight-chain or branched divalent alkylene radical containing from 2 to 6 carbon atoms, X denotes:
- an alkylene radical containing from 2 to 12 carbon atoms, a cyclohexylene radical, or
- an assembly of two groups chosen from alkylene groups containing from 1 to 12 carbon atoms of cyclohexylene radicals, linked together by the valency bond, an oxygen atom, an alkylene or alkylidene group containing from 1 to 4 carbon atoms, or a cyclohexylene or para-phenylene group, Y denotes:
- an alkylene radical containing from 2 to 12 carbon atoms, a phenylene, methylphenylene or dimethylphenylene radical, or
- an assembly of two groups chosen from alkylene groups containing from 1 to 12 carbon atoms, and cyclohexylene, phenylene, methylphenylene or dimethylphenylene radicals linked together by the valency bond, an oxygen atom, an alkylene or alkylidene group containing from 1 to 4 carbon atoms, or a cyclohexylene or para-phenylene group, n is a number from 1 to 400 inclusive, m is a number from 4 to 10 inclusive, and a and R having the meanings given previously.

Among the block copolymers with respect units (I) and (II), more particular mention will be made of those for which the symbols of formulae (I) and (II) have the following meanings:

T denotes: an alkylene group containing not more than 12 carbon atoms, a cyclohexylene group, or a phenylene, methylphenylene or dimethylphenylene group, an assembly of two groups chosen from alkylene groups containing from 1 to 12 carbon atoms, and cyclohexylene, phenylene, methylphenylene, or dimethylphenylene groups, the two groups of the assembly being linked by a valency bond or by one of the following hetero atoms or groups:

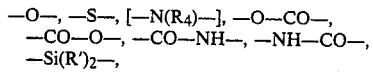

—O—, —S—, [—N(R$_4$)—], —O—CO—,
—CO—O—, —CO—NH—, —NH—CO—,
—Si(R')$_2$—,

R$_4$ denoting a hydrogen atom or an alkyl group containing from 1 to 4 carbon atoms, R' denoting a methyl, vinyl or phenyl radical, it being possible furthermore for the two groups to end in a —Si(R')$_2$— group, R$_1$, R$_2$ and R$_3$ denote: a hydrogen atom or a methyl, ethyl or phenyl group, it being possible for the radicals R$_1$ to R$_2$ together to form a trimethylene or tetramethylene group, R denotes a methyl, vinyl or phenyl radical containing, where appropriate, from 1 to 4 chlorine and/or fluorine atoms, X denotes:
- an alkylene radical containing from 2 to 6 carbon atoms, a cyclohexylene radical, or
- an assembly of two groups chosen from alkylene groups containing from 1 to 6 carbon atoms and cyclohexylene radicals, linked together by the valency bond, an oxygen atom or a methylene group, Y denotes:
- an alkylene radical containing from 2 to 6 carbon atoms, a cyclohexylene, phenylene or methylphenylene radical, or
- an assembly of two groups chosen from alkylene groups containing from 1 to 6 carbon atoms, and cyclohexylene, phenylene or methylphenylene radicals linked together by the valency bond, an oxygen atom or a methylene group, n, m and a having the meaning indicated above.

Polymers which are particularly suitable for making use of the present invention are the block copolymers with repeat units (I) and (II) corresponding respectively to the formulae (I) and (II) in which the symbols have more particularly the following meanings:

X denotes: a straight-chain alkylene radical containing from 2 to 6 carbon atoms, Y denotes:
- an alkylene radical containing from 2 to 6 carbon atoms, a cyclohexylene or phenylene radical, or
- an assembly of two groups chosen from the alkylene groups containing from 1 to 6 carbon atoms, and cyclohexylene groups, linked together by the valency bond, an oxygen atom or a methylene group, Z denotes a divalent radical of formula (III), $$-L-Si(R_2)-O-Si(R)_2]_nL'- \quad \text{(III)}$$

in which:

R denotes a methyl radical, n a number from 1 to 400, and

L and L', which are identical, denote a divalent group of formula (IV):

$$-T-CHR_1-CR_2R_3- \quad \text{(IV)}$$

in which:

T denotes an alkylene group containing not more than 12 carbon atoms, a cyclohexylene, phenylene or methylphenylene group or an assembly of two groups chosen from alkylene groups containing from 1 to 12 carbon atoms, and cyclohexylene groups, the two groups being linked together by the valency bond or by one of the following hetero atoms or groups:

—O—, —O—CO—, —CO—O—, —CO—NH—, —NH—CO—, —Si(R')$_2$—,

R' denoting a methyl radical, $R_1$, $R_2$ and $R_3$ denote a hydrogen atom or a methyl, ethyl or phenyl group, it being possible for the two radicals $R_1$ and $R_2$ together to form a trimethylene or tetramethylene group, and a and m having the meanings given above. Preferably, n is from 10 to 80 inclusive.

By way of examples of various groups forming part of the constitution of the repeat units of the polymer in question there will be mentioned:

Among the groups —T—CHR$_1$—CR$_2$R$_3$—:

—CH$_2$—CH$_2$—CH$_2$—, —(CH$_2$)$_{18}$—, —(CH$_2$)$_{11}$—,

—⟨H⟩—CH$_2$—, —⟨H⟩—CH$_2$—CH$_2$—,

—⟨○⟩—CH$_2$—, —⟨○⟩—CH$_2$—CH$_2$—,

—⟨○⟩—(CH$_2$)$_2$—, —CH$_2$—C(CH$_3$)H—CH$_2$—,
    |
    CH$_3$

—C(CH$_3$)H—C(CH$_3$)H—CH$_2$—, —(CH$_2$)$_6$—O—(CH$_2$)$_3$—,

—(CH$_2$)$_2$—O—(CH$_2$)$_2$—, —⟨○⟩—O—(CH$_2$)$_3$—

—⟨○⟩—O—(CH$_2$)$_p$—Si(CH$_3$)$_2$—(CH$_2$)$_2$—, p = 1, 2 or 3

—⟨○⟩—CO—O—(CH$_2$)$_p$—Si(CH$_3$)$_2$—(CH$_2$)$_2$—, p = 1, 2 or 3

—⟨○⟩—CO—NH—CH$_2$—Si(CH$_3$)$_2$—(CH$_2$)$_2$—,

—continued

—⟨○⟩—Si(CH$_3$)$_2$—(CH$_2$)$_2$—,

—CH$_2$—Si(CH$_3$)$_2$—(CH$_2$)$_2$—, —(CH$_2$)$_3$—Si(CH$_3$)$_2$—(CH$_2$)$_2$—,

—(CH$_2$)$_p$—Si(CH$_3$)$_2$—O—Si(CH$_3$)$_2$—(CH$_2$)$_2$—, p = 1, 2 or 3

Among the results R: the following radicals: methyl, ethyl, propyl, isopropyl, butyl, isobutyl, n-pentyl, t-butyl, chloromethyl, dichloromethyl, α-chloroethyl, α,β-dichloroethyl, fluoromethyl, difluoromethyl, α,β-difluoroethyl, 3,3,3-trifluoropropyl, trifluorocyclopropyl, 4,4,4-trifluorobutyl, 3,3,3,4,4,5,5-heptafluoropentyl, phenyl, p-chlorophenyl, m-chlorophenyl, 3,5-dichlorophenyl, trichlorophenyl, tetrachlorophenyl, o-, p- or m-tolyl, α,α,α-trifluorotolyl, 2,3-dimethylphenyl and 3,4-dimethylphenyl.

Among the symbols X:

—(CH$_2$)$_2$—, —(CH$_2$)$_4$—, —(CH$_2$)$_6$—, —⟨H⟩—,

—CH$_2$—⟨H⟩—CH$_2$—, —(CH$_2$)$_2$—O—(CH$_2$)$_2$—,

—CH$_2$—⟨○⟩—CH$_2$—,

—⟨H⟩—CH$_2$—⟨H⟩—,

Among the symbols Y:

—(CH$_2$)$_6$—, —(CH$_2$)$_4$—, —⟨○⟩—, —⟨H⟩—,

CH$_3$
        |
—⟨○⟩—, —⟨○⟩—, —⟨○⟩—O—⟨○⟩—,
        |
        CH$_3$

—⟨○⟩—CH$_2$—⟨○⟩—,

It should be stated that n and m are not necessarily whole numbers since, in general, the repeat units (I) and (II) correspond to an average formula.

The polysiloxane and polyurethane block copolymers forming part of the constitutions of the compositions according to the invention may be prepared by reacting, in a halogenated hydrocarbon, at least one difunctional compound of formula (1):

$$A-Z-A \quad (1)$$

with at least one diol of formula $$HO-X-OH \quad (2),$$

and with at least one diisocyanate of formula $$OCN-Y-NCO \quad (3),$$

in which A is a hydroxyl or isocyanate function, X, Y and Z have the meanings given when discussing the formulae (I) and (II) at the beginning of the present description, the quantities of the compounds (1), (2) and (3) being such that:

the relationship of the assembly of the NCO functions in relation to the assembly of the OH functions is from 0.9 to 1.1, and that the molar relationship $r=(1)/[(2) \text{ or } (3)]$ is from 0.045 to 0.5, the compound (2) or (3) being such that it reacts with the compound (1) to form the two linking urethane groups.

Thus, when the compound (1) is a macrodiisocyanate bearing the polysiloxane block it is the diol (2) which is the antagonistic compound, and it will be readily apparent to the specialist that, since the overall relationship number of total NCO/number of total OH is fixed, it is the knowledge of the molar relationships of the reactants and, for example, that of the molar relationship macrodiisocyanate/short diol which will make it possible to determine the value of m and hence the length of the rigid segment.

The molar distribution of the various species, difunctional compound (1), diol (2) and diisocyanate (3), will therefore determine the number molecular weight, the distribution between the flexible (polysiloxane) segments and the rigid (urethane) segments and the length of the rigid segment. It is this distribution which makes it possible to obtain thermoplastic elastomers of good quality.

The difunctional compound of formula (1) which may be the diisocyanate $(1)_a$ $$OCN-Z-NCO \quad (1)_a$$

bearing the polysiloxane block or which may be the diol $(1)_b$ $$HO-Z-OH \quad (1)_b$$

bearing the polysiloxane block is itself obtained by a hydrosilation reaction between an α,ω-dihydropolysiloxane of formula (4)

$$H-Si(R)_2-[O-Si(R)_2]_n-H \quad (4)$$

and an olefinic compound bearing an isocyanate or hydroxyl group. The process for producing these difunctional compounds $(1)_a$ and $(1)_b$ will be defined later.

The polysiloxane and polyurethane elastomers are preferably prepared according to a process such as defined earlier and characterized in that the relationship of the assembly of the NCO groups in relation to the assembly of the OH groups is from 0.95 to 1.05 and in that the molar relationship r is from 0.08 to 0.170.

A diisocyanate bearing the polysiloxane block will be advantageously employed as a difunctional compound (1).

As already stated, the polycondensation reaction between the difunctional compound (1) bearing the polysiloxane block, the diol (2) and the diisocyanate (3) must be carried out in a medium ensuring compatibility between the polysiloxane segments and the urethane segments.

This compatibility is obtained essentially through the choice of specified solvents enabling a homogeneous or substantially homogeneous medium to be obtained during the polycondensation reaction. The existence of a totally homogeneous medium throughout the polycondensation reaction is not, however, mandatory. Certain media which become cloudy during the polycondensation reaction nevertheless produce block copolymers processing good elastomeric properties.

The compatibility of the reaction medium is ensured essentially through the choice of specified solvents, as already said, but it must equally be understood that it is also the choice of the nature of the various rigid and flexible sequences which also plays its part in producing this compatibility.

The solvents which essentially ensure this compatibility are aliphatic or aromatic halogenated hydrocarbons. Among these, very particular mention will be made of o-dichlorobenzene and tetrachloroethane.

The quantity of solvent employed can vary within wide limits and is usually between 50% and 95% and preferably between 70% and 80% relative to the total mass of the reactants.

The polycondensation reaction may be performed in the absence or in the presence of catalyst. Any conventional catalyst which is well known in the chemistry of the reaction between an isocyanate group and a hydroxyl group can be suitable; among these, heavy metal derivatives such as dibutyltin dilaurate may be mentioned.

The polycondensation reaction resulting in the block copolymer is carried out simply by heating the reactants to a temperature which is generally between 110° and 180° C. and preferably between 120° and 160° C. The addition of the various reactants may, if appropriate, be performed portionwise. When the reaction is complete, the copolymer is separated from the reaction medium by any known means, for example by precipitation following the addition to a nonsolvent such as an alcohol, for example methanol, ethanol, butanol or a ketone. The block copolymer may also be obtained simply by solvent removal, for example by evaporation.

A diol bearing the polysiloxane block may also be introduced as a difunctional compound (1); the operation is then advantageously performed in two steps. During the first stage, a portion or all of the diisocyanate (3) is added to the reaction mixture consisting of the compound (1) and the solvent, so as to form a "marcodiisocyanate" bearing the polysiloxane block. The remaining reactants are added in a second stage.

When it is desired to employ a diisocyanate bearing the polysiloxane block, the latter will be prepared, for example, by a reaction between an $\alpha,\omega$-dihydropolysiloxane and a monoisocyanate bearing an ethylenic unsaturation and having the following formula:

$$OCN-T-CR_1=CR_2R_3$$

in which T and $R_1$ to $R_3$ have the previously indicated meanings.

It is easy to determine the precise nature of the various isocyanates capable of being employed, bearing in mind that the meanings of the various symbols T, $R_1$, $R_2$ and $R_3$ have already been indicated.

The compounds of the following formulae are more particularly suitable among the unsaturated isocyanates:

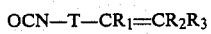
$$CH_2=CH-CH_2-NCO$$

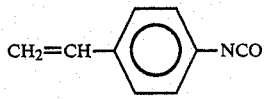

$$CH_2=C(CH_3)-(CH_2)NCO$$

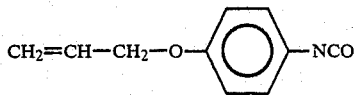

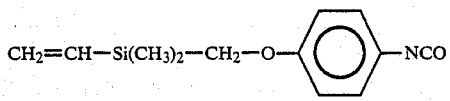

$$CH_2=CH-Si(CH_3)_2-CH_2-NCO$$

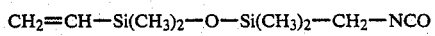
$$CH_2=CH-Si(CH_3)_2-O-Si(CH_3)_2-CH_2-NCO$$

The difunctional compound (1)$_b$ bearing the polysiloxane block may be produced by a hydrosilylation reaction between the $\alpha,\omega$-dihydropolysiloxane of formula (4) and a monoalcohol bearing an ethylenic unsaturation and having the following formula:

$$HO-T-CR_1=CR_2R_3$$

A primary alcohol will preferably be involved. It is easy to determine the precise nature of the various unsaturated alcohols which can be employed, bearing in mind the fact that the meanings of the various symbols T, $R_1$, $R_2$ and $R_3$ have already been indicated.

Allyl alcohol is more particularly suitable.

The hydrosilylation reaction between the unsaturated functional compound and the $\alpha,\omega$-dihydropolysiloxane is carried out by any known method (cf. for example W. Noll: Chemistry and technology of silicones (1968), pages 49 et seq.).

Thus, the hydrosilylation reaction may be carried out by heating the reactants between 150° and 350° C. under autogeneous pressure, in the absence of catalysts. It is also possible to operate in the presence of the usual catalysts, and this permits the use of lower temperatures, of the order of 0° to 200° C., and a faster progress of the reaction at normal pressure. The hydrosilylation reaction may be conducted in the absence of any solvent or by bringing the reactants and, where appropriate, the catalyst into contact in an organic medium consisting of a solvent or a diluent which is inert under the reaction conditions. It is normally possible to employ for this purpose saturated aliphatic hydrocarbons, for example pentane, hexane or heptane, saturated alicyclic hydrocarbons, for example cyclohexane, aromatic hydrocarbons (benzene, toluene), halogenated hydrocarbons: (chloroform, dichloroethane, chlorobenzene) or esters (methyl acetate, ethyl acetate, butyl acetate). The choice of the reaction medium depends on the nature of the starting reactants and on the temperature at which the reaction takes place. The latter may take place in solution or in suspension depending on whether one or both reactants are soluble or insoluble in the chosen medium.

The relative quantities of the unsaturated monofunctional compound and of the $\alpha,\omega$-dihydropolysiloxane may vary within wide limits. Thus, the relative quantity of the reactants expressed as the relationship of the number of the alkenyl groups to the number of the active hydrogen atoms contributed by the hydrosilyl groups may vary from 2 to 0.5. It is preferable, however, that the relationship defined above should be close to 1, it being possible for a slight excess of either of the reactants to be then employed. Thus, the relationship alkenyl group/H may vary between 1.2 and 0.8.

When a catalyst is employed for performing the hydrosilylation reaction, the quantity used may vary within very wide limits depending on the nature of the catalysts, the nature of the reactants employed and the reaction conditions. When the catalyst is platinum or one of its derivatives, the quantity of catalyst, expressed in gram-atoms of metal per alkenyl group present in the unsaturated compound, may vary between $10^{-6}$ and $10^{-1}$ gram-atoms of metal per alkenyl group, and preferably between $10^{-5}$ and $10^{-2}$.

As already indicated, the reaction temperature may vary within wide limits according to whether the operation is carried out in the presence or absence of a catalyst or, in the former case, depending on the nature and the quantity of the catalyst used. Overall, the temperature may vary between 0° and 300° C. and preferably between 20° and 250° C. The use of platinum catalysts makes it possible to operate at temperatures of the order of 10° to 200° C. The reaction may also be carried out at a pressure above, below or equal to atmospheric pressure.

When the hydrosilylation reaction is finished, the difunctional compounds (I) may be separated from the reaction medium and then purified by any known means.

The copolymers according to the invention are characterized both by their good elastomeric properties and their ability to withstand high thermal stresses. In fact, their elasticity modulus varies slightly in a temperature range from ambient temperature to temperatures as high as 160° C.

The potentially adhesive electrically conductive compositions according to the present invention contain particles whose surface at least is electrically conductive. The electrically conductive material is chosen from carbon, titanium carbide, silver and gold. The use of silver is recommended. These particles may comprise a conductive or nonconductive core clad or coated with the electrically conductive material. The core may consist of an electrically conductive metal identical with or different from that of the surface, such as nickel, lead and copper. In most cases the particles are in the form of powder, flakelets or fibrils whose average size is between 0.1 and 50 microns. Silver in the form of flakelets is advantageously employed.

The useful quantity of electrically conductive particles within the potentially adhesive electrically conductive composition according to the invention will depend in particular on the size of the particles, on their morphology and on their electrical conductivity. For particles of a given type, the lower limit is that at which the composition changes towards excessively high resistivities and the upper limit is that at which the adhesive and/or film-forming properties of the composition exhibit marked deterioration.

The person skilled in the art and wishing to obtain a given electrical conductivity and given adhesive and/or film-forming properties which can be determined, respectively, by measuring an electrical conductivity, a stripping resistance or shear strength, hardness and/or modulus of elasticity, under specified conditions and in accordance with the usual standards and methods, will be capable of specifying the optimum quantity of electrically conductive particles to be incorporated in the composition in the case of a given polymer, and of doing this without, however, resorting to experimentation going beyond the scope of mere routine.

For example, carbon particles which are available in an average size of between 0.04 and 10 microns can be employed in a proportion of 15 to 30% by weight of the solids content of the potentially adhesive electrically conductive composition.

Where particles of titanium carbide which are available in an average size of between 0.1 and 50 microns are concerned, these can be employed in a proportion of 80 to 85% by weight of the solids content of the potentially adhesive electrically conductive composition.

The particles of silver which are available in this same size range can be employed in a proportion from 60 to 85% by weight of the solids content of the potentially adhesive electrically conductive composition. It is preferable to resort to particles whose morphology is capable of giving the maximum contact per unit weight, such as flakelets.

Various conventional methods may be employed to incorporate the particles in the copolymer. The particles may be incorporated merely by being mixed with the powdery copolymer or in the molten state.

It is also possible to incorporate the particles merely by mixing them with a solution or dispersion of the copolymer in a solvent or diluent, which may be identical with or different from those or that which has been used in its preparation.

To this end, use may be made of aliphatic or aromatic chlorinated hydrocarbons such as tetrachlorethane and ortho-dichlorobenzene or of N-methyl-2-pyrrolidone. It is possible, of course, to incorporate the particles in the copolymer in solution either at the end of its preparation (before its precipitation) or after it is redissolved. It is then possible to evaporate off the solvent under reduced pressure or, where appropriate, to precipitate the filled copolymer when the latter settles relatively easily and then to recover the filled solid simply by filtering.

For satisfactory homogeneity of the mixture it is preferable to incorporate the particles in question in a solution of the copolymer.

By way of examples of copolymers which can be suitable for the preparation of the compositions according to the invention there may be mentioned the block copolymers consisting of a concatenation of the following recurring repeat units:

POLYMER 1:

Repeat unit 1:

Repeat unit 2:

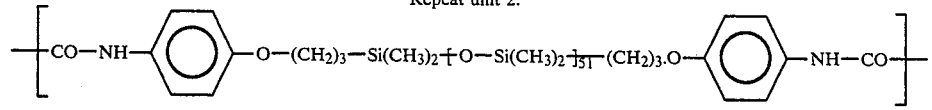

POLYMER 2:

Repeat unit 1:

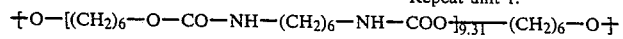

-continued
Repeat unit 2:
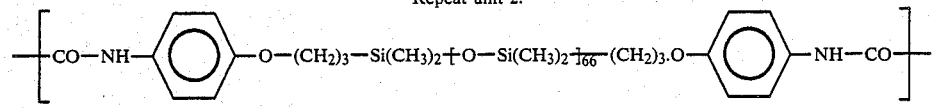
POLYMER 3:
Repeat unit 1:
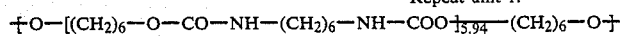
Repeat unit 2:
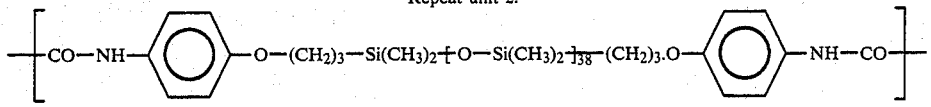
POLYMER 4:
Repeat unit 1:
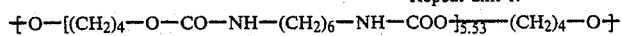
Repeat unit 2:
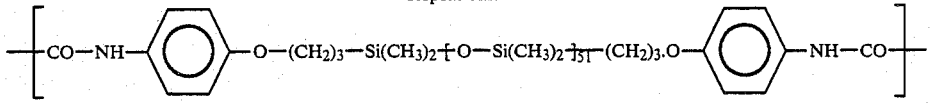
POLYMER 5:
Repeat unit 1:
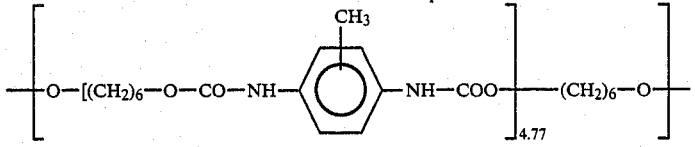
Repeat unit 2:
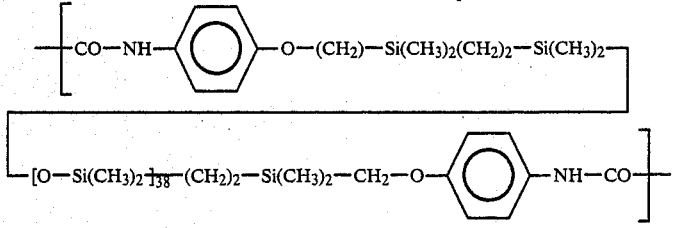
POLYMER 6:
Repeat unit 1:
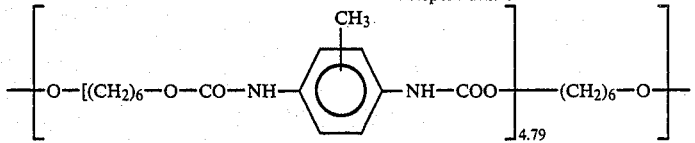
Repeat unit 2:
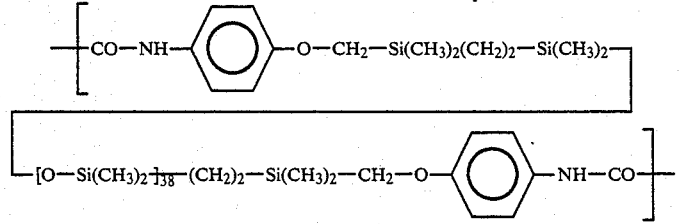
POLYMER 7:

-continued
Repeat unit 1:
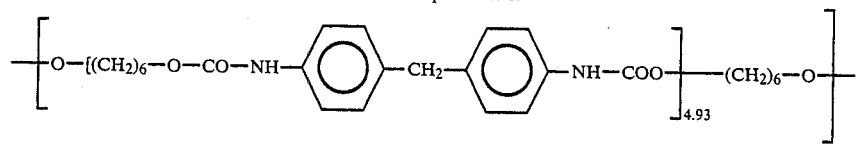
Repeat unit 2:
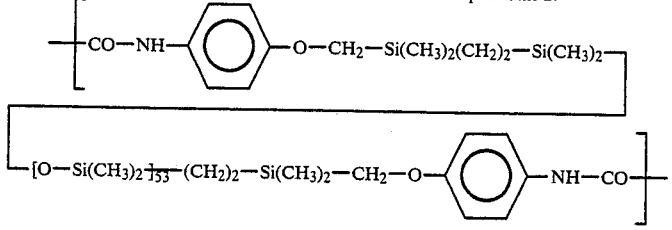
POLYMER 8:
Repeat unit 1:
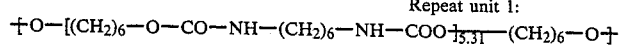
Repeat unit 2:
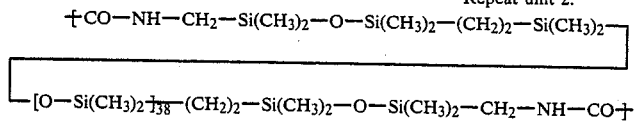
POLYMER 9:
Repeat unit 1:
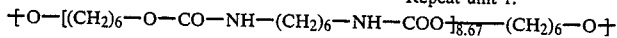
Repeat unit 2:
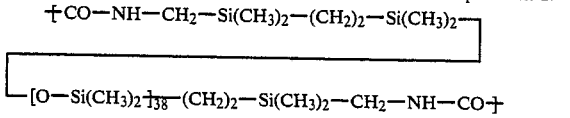
POLYMER 10:
Repeat unit 1:
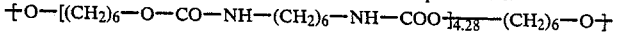
Repeat unit 2:
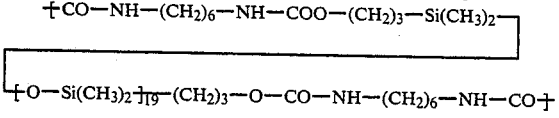
POLYMER 11:
Repeat unit 1:
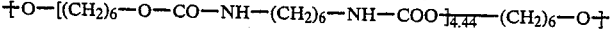
Repeat unit 2:
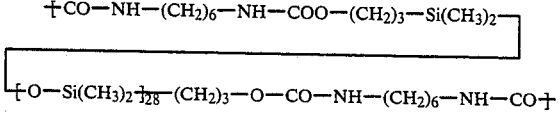
POLYMER 12:
Repeat unit 1:
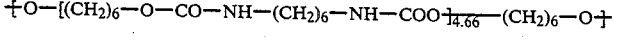
Repeat unit 2:
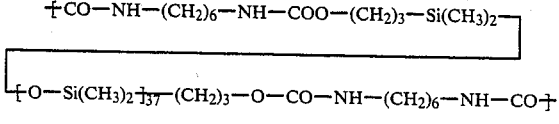

POLYMER 13:

Repeat unit 1:
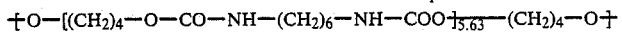

Repeat unit 2:
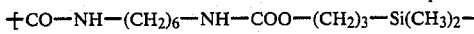

POLYMER 14:

Repeat unit 1:
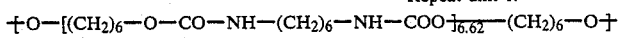

Repeat unit 2:
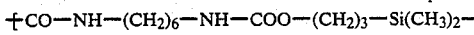

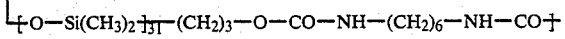

The preferred compositions according to the present invention are those which comprise from 100 to 20 parts by weight of copolymer and from 0 to 80 parts by weight of a solvent or diluent, the optimum quantity of solvent or diluent depending to a large extent on the number average molecular mass and hence on the viscosity of the copolymer employed in practice in a given solvent.

The more particularly recommended among these are those in which the copolymer consists of a concatenation of recurring repeat units (I) and (II) corresponding respectively to the formulae (I) and (II) indicated at the beginning of the present description and in which the various symbols assume any of the sets of preferred meanings, also at the beginning of the present description, and/or which comprise a solvent or diluent chosen from those already mentioned.

The compositions advantageously contain from 20 to 70 parts by weight of copolymer with 80 to 30 parts by weight of solvent or diluent.

The solvent or diluent is advantageously chosen from ortho-dichlorobenzene, tetrachloroethane and N-methyl-2-pyrrolidone.

The compositions according to the invention may, of course, contain minor quantities of adhesion promoters and/or nucleating agents or even, within the scope of certain special applications, of peroxides which will limit the "reversible" nature after use of these compositions.

As was indicated at the beginning of the present description, the potentially adhesive electrically conductive compositions according to the invention are characterized in that they are capable of being shaped without recourse to chemical reactions such as crosslinking, addition and condensation. These compositions are stable in storage even at temperatures of the order of 100° C. and easy to handle, especially by virtue of the fact that they are "single-component".

In the presence of solvent or diluent and/or when their temperatures are raised to a temperature not exceeding either the boiling point of the solvent or diluent or 250° C. in the absence of solvent or diluent, they may take the appearance of a paste or of a more or less viscous liquid and may be given the form of a film-forming collodion. They may also be taken to a rheological state which is compatible with serigraphic printing techniques and may be employed for the adhesive bonding of components of complex surface geometry.

The potentially adhesive electrically conductive compositions according to the invention permitting bonding between two devices without welding, in the absence of elevated temperature and/or pressure, may be employed in the adhesive bonding of integrated circuits or other devices which are fragile or tricky to handle.

When applied in the molten state at a temperature of the order of 120° to 200° C. depending on the structure of the rigid sequence of the copolymer, they may be extruded or injection- or compression-moulded.

These compositions may be used as a starting material for the manufacture of a preform such as a sheet, a tape, a tablet and more generally a self-supporting film whose thickness will generally attain from 110% of the average size of the electrically conductive particles to 100 microns, it being also possible to contemplate greater thicknesses. These films have mechanical properties which are sufficient to enable them to be handled by a machine without being reinforced, which is noteworthy, bearing in mind the fact that the electrically conductive fillers, especially those of silver, tend to have an embrittling effect in the quantities in which they are employed to produce electrical conductivity.

From the preform it is possible to cut out, for example, tablets of suitable size using conventional cutting techniques such as sawing or the use of cutting discs, it being possible for the rejects such as defective tablets to be recycled to the preparation of the preform merely by melting or dissolving in a solvent by virtue of the reversible nature of the adhesive.

As indicated at the beginning of the present description, the conductive adhesive film produced from a potentially adhesive electrically conductive composition according to the present invention may be either dissolved in a suitable solvent or remelted thermally, even when it has been inserted between two surfaces in order to fasten them to each other. It is therefore possible to remove a defective adhesively bonded component in order to replace it altogether or to replace it after repair. The polymer solution may once again be used for the preparation of a conductive adhesive film.

It is also possible to impregnate a fibrous sheet, for example a glass fibre cloth in order to form a reinforced film if need be.

The production of a self-supporting film may be carried out by spreading or deposition with a doctor blade on a nonadhesive surface such as a surface coated with Teflon ®, with a dissolved or molten composition.

The conductive and flexible adhesive film which is obtained has elastomeric properties which enable it to withstand without appreciable damage the stresses associated with differential thermal changes. This film is normally not adhesive at ordinary ambient temperature (of the order of 25° C.), and this is of considerable advantage.

The adhesion of the film to a surface is produced by heat-welding at a temperature above that of the melting point of the rigid sequence of the copolymer and below 220° C.

The potentially adhesive electrically conductive compositions such as the films according to the invention possess both an excellent resistance to chemical and atmospheric agents and easy processability, as has just been indicated, since their adhesiveness is normally zero at ambient temperature and at temperatures of the order of 100° C. Various practical advantages may be drawn from the absence of chemical reactions during the fabrication stage of the potentially adhesive electrically conductive compositions such as films according to the invention.

The potentially adhesive electrically conductive compositions (such as the films) according to the present invention may be employed in the absence of any solvent, and in certain compositions this represents a major advantage. In fact, they may be employed merely by heating a tablet or a small, more or less pasty or powdery lump of potentially adhesive electrically conductive composition up to the softening point of the assembly, followed by keeping under pressure the surface to be adhesively bonded and the softened adhesive, or a layer of conductive adhesive which is softened and sandwiched between two surfaces to be joined together. The use is therefore instantaneous.

So far as surfaces which are adherent or capable of being joined together by means of a layer of potentially adhesive electrically conductive composition are concerned, there may be mentioned silicon wafers and chips cut from such wafers and, more particularly, the back of these substrates, that is to say the surface opposed to that which is generally polished, on which the integrated circuits are developed.

There may also be mentioned the surface of an alumina board, it being possible for the adherent face (like that of the silicon chip or wafer) to be coated with gold or with silver, the noncontinuous collective interconnection surfaces employed in the manufacture of hybrid circuits, and copper, chromium, nickel, titanium, tungsten or gold surfaces. There may furthermore be mentioned deformable metallic or nonmetallic surfaces, for example the surface of a polyamide film. The adherent surface may be noncontinuous, may take the form of a tape several tens of micrometers in thickness, etc.

A tape made from a potentially adhesive electrically conductive composition according to the invention, even when not coated with a metal tape, may be employed as temporary conveyance in the technique of automatic belt conveying.

Various uses and assembly methods will be apparent to the person skilled in the art, bearing in mind the detailed information at the beginning of the present description and the number of illustrations which have just been discussed.

The following examples illustrate the invention.

(1) Preparation of a polydimethylsiloxane-polyurethane multi-block copolymer containing the following repeat units:

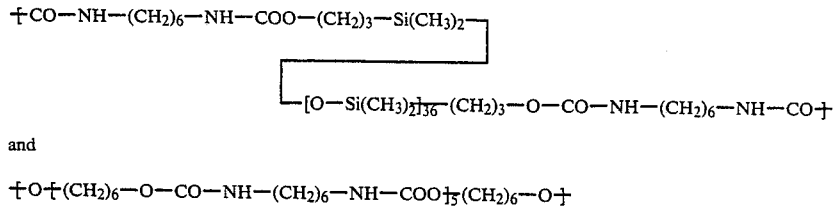

and $+O+(CH_2)_6-O-CO-NH-(CH_2)_6-NH-COO\}_5(CH_2)_6-O+$

Into a stirred reactor containing 1125 g of o-dichlorobenzene are introduced:

a polysiloxane macrodiol namely 225.02 g (0.079 mole) of α,ω-bis(γ-hydroxypropyl)polydimethylsiloxane of formula:

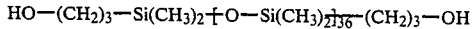

56.4 g (0.478 mole) of 1,6-hexanediol, and
93.64 g (0.557 mole) of 1,6-diisocyanatohexane.

An overall NCO/OH molar relationship equal to 1.000 is thus calculated.

The reactor is purged and maintained under a nitrogen atmosphere and is then heated with stirring for 17 hours to a temperature of between 128° and 133° C.

The copolymer is isolated by precipitation on being added to methanol (2.4 l).

After the precipitate has been dried in the oven, 306 g of rubbery flakes are obtained.

A small plate produced by compression moulding (10 to 15 min at 180° C.), 2 mm thickness and transparent has the following properties:

Shore A hardness: 91 points, according to French Standard NFT 51109,

Tensile strength (at 20° C.): 88 kg/cm² according to French Standard NFT 46002,

Elongation at break (at 20° C.): 78% according to French Standard NFT 46002.

(2) Preparation of silver-filled flexible films:

The copolymer and N-methylpyrrolidone are introduced into a glass reactor fitted with a stirrer and swept with a stream of nitrogen.

This mixture is stirred and heated to 80° C.

As soon as the copolymer appears to be completely dissolved, gradual addition of silver powder is commenced.

The suspension which forms is stirred slowly for 20 min. The suspension is then spread hot onto a nonadhesive planar surface (a Teflon ® plaque).

The solvent is evaporated off in an oven at 120° C. under reduced pressure, for 1 hour.

Two flexible and handlable films, a few tens of microns in thickness, whose characteristics are shown in the table below, are thus prepared in succession.

(3) Measurement of electrical conductivity:

A strip 6 cm in length and 3 mm in width is cut from each of the two films whose preparation is described above and its electrical resistance is measured. The volume resistivity is shown in the table below.

(4) Adhesive bonding of a component using a film prepared in this manner:

Each of the two films was employed for bonding silicon components onto alumina substrates.

The procedure used was as follows:

A preform whose dimensions are slightly larger than that of the "chip" to be adhesively bonded is cut out of the film.

This preform is placed between the alumina substrate and the back face of the "chip", this face being coated with gold.

The "sandwich" formed in this manner is then placed between the platens of a heated press.

After pressure has been applied, the component fastened onto the alumina substrate is withdrawn from the press and cooled to ambient temperature.

Temperature of the press platens: 160° C.,

Force applied to the "chip": approximately 5 daN (for approximately 1 s),

Number of adhesive bondings produced: 5.

The shear stress which needs to be applied in order to strip, at 25° C., the component from its alumina support has been measured with the aid of a Dage Microtester 22 apparatus (die-shear test).

The values obtained are indicated in the table below.

| SINGLE TABLE | | |
|---|---|---|
| FILM | No. 1 | No. 2 |
| Quantity of copolymer (in g) | 1.0168 | 2.0402 |
| Quantity of N—methylpyrrolidone (in g) | 4.0163 | 8.0190 |
| Silver powder (in g) | 3.0449 | 3.7181 |
| Silver content of the film (wt %) | 75 | 65 |
| Film thickness in micrometers | 45 | 110 |
| Volume resistivity at 25° C. in ohm cm | 5 · 10⁻⁴ | 10⁻³ |
| Shear strength at 25°0 C. (die-shear) MPa | 2.5 | 2.4 |

I claim:

1. An electrically conductive, potentially adhesive composition which comprises (a) a thermoplastic block copolymer having elastic properties and consisting of polysiloxane and urethane groups with a concatenation of recurring repeat units of formula I and formula II $$—O—(X—O—CO—NH—Y—NH—CO—O)_mX—O— \quad (I)$$

$$—CO—NH—(Y—NH—CO—O)_q—Z—(O—CO—NH—Y)_q—NH—CO— \quad (II)$$

in which

Z, having the formula III, denotes a divalent radical bearing a polysiloxane block $$—L—Si(R_2)—O—Si(R)_2]_n—L'— \quad (III)$$

wherein

L and L', which are identical or different, denote divalent radicals of formula IV $$—T—CHR_1—CR_2R_3— \quad (IV)$$

where

T denotes a divalent radical forming part of the molecular structure of an unsaturated isocyanate or an unsaturated alcohol of the formulae $$OCN—T—CR_1=CR_2R_3$$

or $$HO—T—CR_1=CR_2R_3$$

these radicals T being hydrocarbon in nature and containing 1 to 20 carbon atoms, or said radicals including one or more hetero atoms or groups chosen from oxygen, sulfur, silicon and nitrogen atoms and ester or amide groups, $R_1$, $R_2$ and $R_3$ independently denote a hydrogen atom or an alkyl or aryl group, or $R_1$ and $R_2$ together are alkylene, R, which are identical or different, denote alkyl radicals containing 1 to 5 carbon atoms or said alkyl radicals containing 1 to 7 chlorine or fluorine atoms or mixture thereof; cycloalkyl containing 3 to 8 carbon atoms or said cycloalkyl radicals containing 1 to 4 chlorine or fluorine atoms or mixture thereof; alkenyl radicals containing 2 to 5 carbon atoms; aryl or alkylaryl radicals containing 6 to 8 carbon atoms, or said aryl radicals containing 1 to 4 chlorine or fluorine atoms or mixture thereof;

n is a number from to 1000,

X and Y denote divalent radicals of hydrocarbon nature corresponding, respectively, to the diol X(OH)₂ and to the diisocyanate Y(NCO)₂, each containing 2 to 20 carbon atoms, m denotes a number from 1 to 20, and z is zero or 1, and (b) an effective amount, sufficient to afford electrical conductivity to the composition, of particles with at least the surface of said particles being electrically conductive.

2. A composition according to claim 1 where in the thermoplastic block copolymer of component (a)

T denotes an alkylene, cycloalkylene, arylene, alkylarylene or arylalkylene group, a concatenation of two groups chosen from alkylene, cycloalkylene and arylene groups and linked together by the valency bond, an oxygen atom, a sulfur atom, an ester or amide group or a nitrogen containing group in which $R_4$ denotes a hydrogen atom or an alkyl group, or a diorganosilyl group in which R' denotes a methyl, vinyl or phenyl radical or said radical being halogenated, $R_1$, $R_2$ and $R_3$ denote a hydrogen atom, an alkyl radical containing 1 to 4 carbon atoms, phenyl or tolyl, or $R_1$ and $R_2$ together form a straight-chain or branched divalent alkylene radical containing 2 to 6 carbon atoms, X denotes an alkylene radical containing 2 to 12 carbon atoms, cyclohexylene, or an assembly of two groups chosen from alkylene groups containing 1 to 12 carbon atoms and cyclohexylene radicals, linked together by the valency bond, an oxygen atom, an alkylene or alkylidene group containing 1 to 4 carbon atoms; or a cyclohexylene or p-phenylene group, Y denotes an alkylene radical containing 2 to 12 carbon atoms, phenylene, methylphenylene or dimethylphenylene, or an assembly of two groups chosen from alkylene groups containing 1 to 12 carbon atoms and cyclohexylene, phenylene, methylphenylene or dimethylphenylene radicals linked together by the valency bond, an oxygen atom, an alkylene or alkylidene group containing 1 to 4 carbon atoms; or a cyclohexylene or p-phenylene group, n is a number from 1 to 400, m is a number from 4 to 10, and a and R have the meanings given in claim 1.

3. A composition according to claim 1 where in the thermoplastic block copolymer of component (a)

T denotes an alkylene group containing not more than 12 carbon atoms, cyclohexylene, phenylene, methylphenylene or dimethylphenylene; an assembly of two groups chosen from alkylene groups containing from 1 to 12 carbon atoms, and cyclohexylene, phenylene, methylphenylene or dimethylphenylene groups, the two groups of the assembly being linked by a valency bond or by one of the following hetero atoms or groups: —O—, —S—, —O—CO—, —COO— —CONH—, —NHCO—, —Si(R')$_2$—; $R_4$ denotes a hydrogen atom or an alkyl group containing 1 to 4 carbon atoms, R' denotes methyl, vinyl or phenyl; it being possible for the two groups to end in a —Si(R')$_2$— group, $R_1$, $R_2$ and $R_3$ denote a hydrogen atom or methyl, ethyl or phenyl, or $R_1$ and $R_2$ together form trimethylene or tetramethylene-, R denotes a methyl, vinyl or phenyl radical, or said radical containing 1 to 4 chlorine or fluorine atoms or mixture thereof, X denotes an alkylene radical containing 2 to 6 carbon atoms, cyclohexylene, or an assembly of two groups chosen from alkylene groups containing 1 to 6 carbon atoms, and cyclohexylene radicals linked together by the valency bond, an oxygen atom or a methylene group, Y denotes an alkylene radical containing 2 to 6 carbon atoms, cyclohexylene, phenylene or methylphenylene, or an assembly of two groups chosen from alkylene groups containing 1 to 6 carbon atoms, and cyclohexylene, phenylene or methylphenylene radicals linked together by the valency bond, an oxygen atom or a methylene group, and n, m and a have the meanings given in claim 1.

4. A composition according to claim 1 where in the thermoplastic block copolymer of component (a)

X denotes a straight-chain alkylene radical containing 2 to 6 carbon atoms,

Y denotes an alkylene radical containing 2 to 6 carbon atoms, cyclohexylene or phenylene, or an assembly of two groups chosen from alkylene groups containing 1 to 6 carbon atoms and cyclohexylene, linked together by the valency bond, an oxygen atom or a methylene group, Z denotes a divalent radical of formula III $$-L-Si(R_2)-O-Si(R)_2]_n-L'- \quad (III)$$

in which

R denotes methyl, n is a number from 1 to 400, and

L and L', which are identical, denote a divalent group of formula IV $$-T-CHR_1-CR_2R_3- \quad (IV)$$

in which

T denotes an alkylene group containing not more than 12 carbon atoms, cyclohexylene, phenylene or methylphenylene, or an assembly of two groups chosen from alkylene groups containing 1 to 12 carbon atoms and cyclohexylene, the two groups being linked together by the valency bond or by one of the following hetero atoms or groups:

—O—, —O—CO—, —COO—, —CONH—, —NHCO—, —Si(R')$_2$—,

R' denotes methyl, $R_2$, $R_2$ and $R_3$ denote a hydrogen atom or methyl, ethyl or phenyl, or $R_1$ and $R_2$ together form trimethylene or tetramethylene, and a and m have the meanings given in claim 1.

5. A composition according to claim 1 wherein the conductive particles of component (b) are carbon, titanium carbide, silver or gold.

6. A composition according to claim 5 wherein the conductive particles are silver.

7. A composition according to claim 5 wherein the conductive particles are carbon.

8. A composition according to claim 5 where in the conductive particles are titanium carbide.

9. Composition according to claim 1, characterized in that it also contains a solvent or diluent.

10. Composition according to claim 9, characterized in that the solvent or diluent represents from 0 to 80 parts by weight for from 100 to 20 parts by weight of copolymer.

11. Composition according to claim 9, characterized in that the solvent or diluent is selected from the group consisting of
halogenated aliphatic hydrocarbons,
halogenated aromatic hydrocarbons, and
N-methyl-2-pyrrolidone.

12. Composition according to claim 11, characterized in that the solvent or diluent is selected from tetrachloroethane and ortho-dichlorobenzene.

13. Composition according to claim 11, characterized in that the solvent or diluent is N-methyl-2-pyrrolidone.

14. Composition according to claim 9, characterized in that the solvent or diluent represents from 30 to 80 parts by weight for 70 to 20 parts by weight of copolymer.

15. Composition according to claim 6, characterized in that the silver particles have a mean size of between 0.1 and 50 microns and in that they represent from 60 to 85% by weight of the solids content of the composition.

16. Composition according to claim 4, characterized in that n is from 10 to 80.

* * * * *